United States Patent [19]

Teague

[11] Patent Number: 5,136,291
[45] Date of Patent: Aug. 4, 1992

[54] TRANSMITTING BINARY DATA FILES USING ELECTRONIC MAIL

[75] Inventor: Tommy K. Teague, Valencia, Calif.

[73] Assignee: Unisys Corporation, Detroit, Mich.

[21] Appl. No.: 620,977

[22] Filed: Nov. 30, 1990

[51] Int. Cl.$^5$ ............................................. H03M 7/06
[52] U.S. Cl. ......................................... 341/83; 341/55; 341/90; 364/284.4
[58] Field of Search ............... 340/825.44; 178/2 B; 364/200, 284.4, 940.62, 242.95; 341/50, 55, 83, 90, 91, 99

[56] References Cited

U.S. PATENT DOCUMENTS

| | | | |
|---|---|---|---|
| 3,736,412 | 5/1973 | Wright | 341/83 |
| 4,342,027 | 7/1982 | Hanson | 341/83 |
| 4,752,765 | 6/1988 | Larson | 341/55 |
| 4,789,852 | 12/1988 | Bailey et al. | 341/50 |

OTHER PUBLICATIONS

Manukyan, et al., "A Code Converter for Data Transmission Over Communications Channels", Telecommunications and Radio Engineering Part 1, vol. 31, No. 6, Jun. 1977.

Primary Examiner—Howard L. Williams
Attorney, Agent, or Firm—Nathan Cass; M. Starr

[57] ABSTRACT

Improved means and methods are provided for transmitting binary data on a communication system, such as E-mail, which restricts the number of acceptable characters that can be transmitted. In a preferred embodiment, the binary data to be transmitted is first subjected to a Welch compression and then converted into base-85 digits for transmission. At the receiving end, the received base-85 digits are converted back into compressed binary and then subjected to Welch decompression to obtain the original binary data.

11 Claims, 2 Drawing Sheets

TRANSMITTING BINARY DATA FILES USING ELECTRONIC MAIL

BACKGROUND OF THE INVENTION

This invention relates to an improved method for sending binary data using a data communication system, which restricts the number of data characters which are acceptable for transmission such as electronic mail (E-mail).

E-mail systems are well known in the art for communicating data from one location to another location. Typically, data sent by electronic mail is in the form of 8-bit characters or bytes (a byte comprises 8-bits). It will be understood that $2^8$ or 256 different characters may be represented by these 8-bit characters. However, because particular ones of these 256 characters are reserved by the E-mail system for data communication protocol purposes, only the remaining ones of these 256 characters can be used for transmitting data, which are typically those which are present on the keyboard of a terminal, such as the keyboard of a personal computer. These data characters are typically referred to as displayable, printable or text characters. The number of data characters which can be transmitted by an E-mail system may be further restricted, since data communication lines frequently support only 7-bit codes, reserving the eighth bit as a parity check. In such case, only a total of 128 characters (data plus control characters) are available.

Since E-mail systems typically permit transmission of only a limited number of the 256 possible values provided by an 8-bit (one-byte) representation, as explained above, a problem is presented when it is desired to use E-mail for transmitting binary data, such as, for example, the contents of a file stored in the memory of a personal computer. Accordingly, when E-mail is to be used for such purpose, the binary file has to be modified so that its 256 8-bit data characters are converted into the particular subset of data characters which the E-mail system is able to deal with. Known methods for this purpose have the disadvantage of requiring the transmission of a significant number of extra bits and a relatively complicated implementation.

SUMMARY AND OBJECTS OF THE INVENTION

It is accordingly, a broad object of the present invention to provide new and improved methods for transmitting binary data using a transmission system, such as E-mail, which restricts the number of data characters which are acceptable for transmission.

A more specific object of the invention, in accordance with the foregoing object, is to provide a new and improved method for converting binary data into characters acceptable to the transmission system.

Another object of the invention, in accordance with the foregoing object, is to provide a new and improved method for reconverting received binary data into the original binary data prior to conversion.

A further object of the invention, in accordance with the foregoing objects, is to provide methods which can be relatively simply implemented.

A still further object of the invention, in accordance with the foregoing objects, is to provide methods which require a minimum number of extra bits required to be transmitted.

In a particular preferred embodiment of the invention, the above objects are accomplished by employing a method which considers the binary data to be transmitted as being comprised of a sequence of 32-bit characters, and then performs a base-85 conversion on these 32-bit characters to produce acceptable characters for transmission. At the receiving end, the received characters are converted back to the original binary data.

The specific nature of the invention as well as other objects, features, advantages and uses thereof will become evident from the following detailed description along with the accompanying drawings.

DETAILED DESCRIPTION OF A PREFERRED EMBODIMENT

Figure 1:
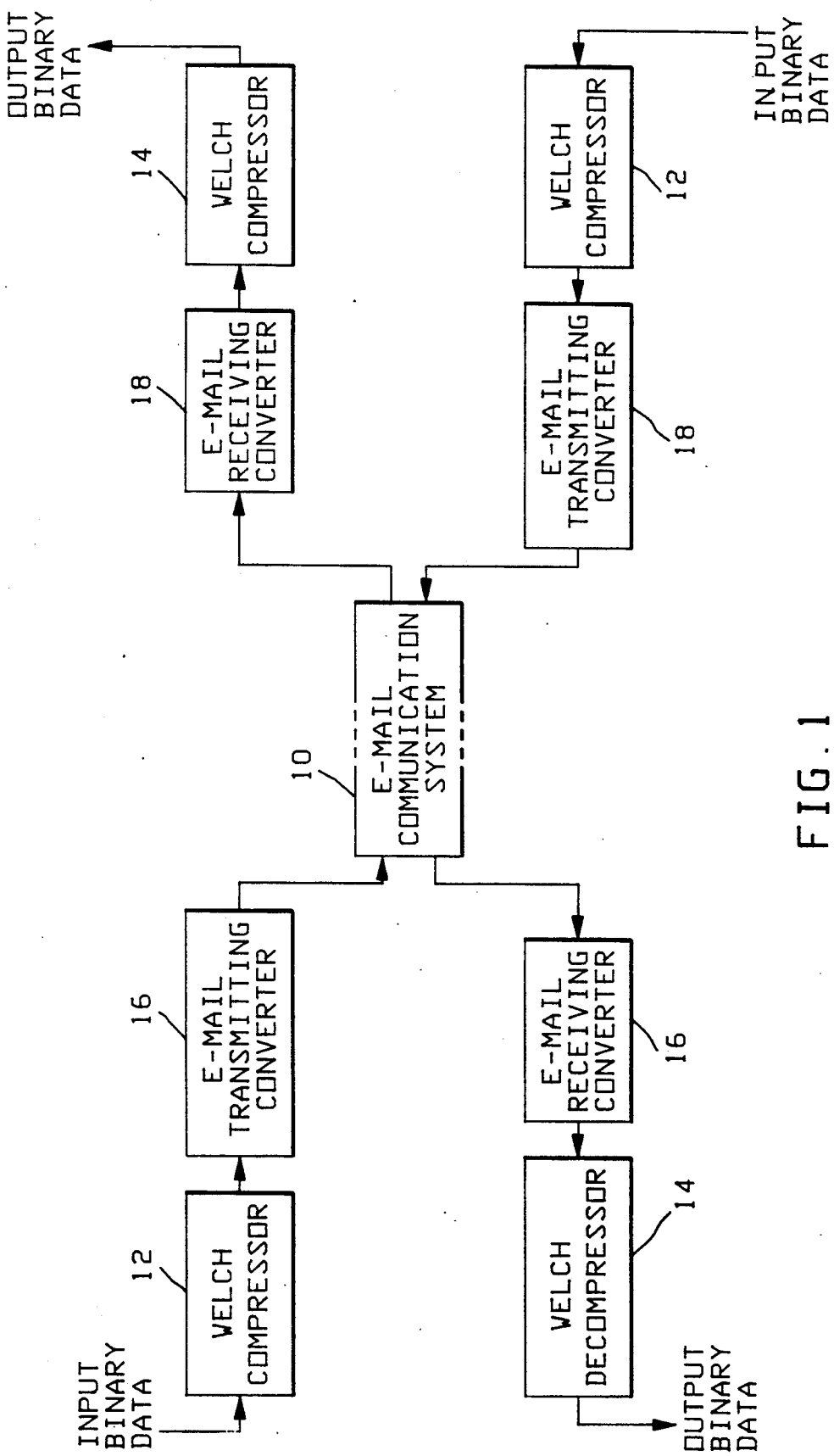
FIG. 1 is a block diagram illustrating an implementation of the present invention.

Like numerals and characters refer to like elements throughout the figures of the drawings.

Before proceeding to a detailed description of a preferred embodiment of the invention, it will be helpful to initially consider two well known methods for transmitting binary data using E-mail transmission.

Perhaps the most common known way of converting binary data for E-mail transmission is to use a 4-bit to 8-bit conversion method in which the binary data to be transmitted is considered to be comprised of a sequence of 4-bit hex digits, each hex digit being converted into its ASCII 8-bit representation for transmission purposes. For example, binary data comprised of the 8-bits 01000101 is represented as two 4-bit hex digits 0100 and 1010, which correspond to hex digits "4" and "A", respectively. The ASCII equivalent of "4" is 34 and the ASCII equivalent of "A" is 41. Thus, to transmit the original 8-bit binary data 01000101 using this 4-bit to 8-bit conversion system, the following two 8-bit ASCII characters are transmitted respectively corresponding to 34 and 41:

00110100 0100001

At the receiving end, the received ASCII numbers 34 and 41 are converted back to the original 8-bit string 01000101.

It will be understood that the 4-bit to 8-bit conversion method described above has the advantage of requiring use of only the 16 displayable hex digits "0" through "9" and "A" through "F". However, as will be evident from the above example, this method presents the disadvantage of requiring that twice as many bits be transmitted as were present in the original file.

Another well known approach is to use a 6-bit to 8-bit conversion method in which the binary data to be transmitted is considered to be comprised of a sequence of 6-bit numbers. Since $2^6=64$, these 6-bit numbers can be used as an index into a set of 64 characters which are acceptable to the E-mail transmission protocol. For example, assume that the following 64-element set is acceptable to the E-mail system:

ABCDEFGHIJKLMNOPQRSTUVWXYZ  (1)
abcdefghijklmnopqrstuvwxyz
0123456789-/ wherein the first character "A" is represented by the 6-bit number 000000, the second character "B" is represented by the 6-bit number 000001 and so on, until the sixty-fourth character / is reached which is represented by the 6-bit number 111111=63.

An example of this 6-bit to 8-bit conversion will now be presented. For this example, it will be assumed that the binary data to be transmitted comprises three 8-bit bytes (24-bits) as follows:

00110101 01001111 00011100  (2)

In accordance with the 6-bit to 8-bit conversion method being described, the three 8-bit bytes shown in (2) above are considered to be four 6-bit numbers as follows:

001101 010100 111100 011100  (3)

The values represented by these four 6-bit numbers in (3) above are used as indexes into the set of (1) above as follows: the first 6-bit number 001101 in (3) above has the value 13 and thus corresponds to the thirteenth character "N" of the 64-character set shown in (1) above; the second 6-bit number 010100 in (3) above has the value 20 and thus corresponds to the twentieth character "U" of the set shown in (1) above; the third 6-bit number 111100 in (3) above has the value 60 and thus corresponds to the sixtieth character "8" of the set shown in (1) above; and the fourth 6-bit number 011100 in (3) above has the value 28 and thus corresponds to the twenty-eighth character "c" of the set shown in (1) above.

Based on the above indexing, the original 24 bit binary data in (2) above is represented by the following four displayable characters of the character set shown in (1) above:

NU8c  (4)

These four characters N U 8 c are then transmitted by the E-mail system using their respective ASCII 8-bit equivalents set forth in hex below:

4E55 38 63 which in binary corresponds to:

01001110 01010101 00111000 01100011

In accordance with the present invention, a new and improved approach is provided for sending binary data using E-mail. This new approach requires sending significantly fewer binary bits than is possible using presently known methods. More specifically, in the preferred embodiment of this new approach to be described herein, each 4-bits of binary data requires that only 5-bits be transmitted by the E-mail system. This compares with the requirement of sending 8-bits for every 4-bits of binary data in the first previously described system, and 6-bits for every 4-bits of binary data in the second previously described system.

The new and approved approach of the present invention will now be considered with respect to a particular preferred embodiment which uses a set containing the following characters which are acceptable to the E-mail system:

ABCDEFGHIJKLMNOPQRSTUVWXYZ  (5)
abcdefghijklmnopqrstuvwxyz
0123456789( )
"[ ]{ }< >:;,.+ = #$%&*-/

In the preferred embodiment, the binary data to be transmitted is considered to be comprised of sequences of umbers. For example, assume that the following 8-bytes (64-bits) of binary data (represented in hex) is to be transmitted:

35 4F 1C 2D 17 A2 B4 9C  (6)

In the preferred embodiment this binary data in (6) above is considered as two 32-bit numbers as follows:

354F1C2D 17A2B49C  (7)

The manner in which each of the two 32-bit numbers in (7) above is transmitted in the preferred embodiment of the invention will be illustrated using the first 32-bit number 354F1C2D.

For the purposes of the preferred embodiment, the first 32-bit number 354F1C2D in (7) above is converted into a base-85 number, that is, a number having a radix of 85. One way for accomplishing this conversion is to employ an iterative divide-by-radix, approach, such as described in U.S. Pat. No. 4,342,027, using the following divide-by-radix iterative for converting a number N represented in a first base (radix $r_1$) into a number M in a second base (radix $r_2$):

$$\frac{Q_{j-1}}{r_2} = Q_j + b_j \quad (8)$$

where j=1, 2,....n, $Q_o$ (obtained when j=1) is the number N in radix $r_1$ which is to be converted to the number M in radix $r_2$, $r_2$ is radix $r_2$ expressed in radix $r_1$; $Q_j$ is the quotient of the $j^{th}$ iteration, n is the number for which the quotient $Q_j$=o, $b_j$ is the remainder of the $j^{th}$ division and is also the converted digit in radix $r_2$; and M in radix $r_2$ is formed by assembling the $b_j$ remainders for j-1,2,....n such that M=$b_n$...$b_2b_1$.

To illustrate how equation (8) above is used, the 32-bit hex number 354F1C2D in (7) above will be converted into a base-85 number using its decimal (base-10) equivalent given below, since decimal division is easier to understand:

(354F1C2D)hex=(894377005)decimal

Using equation (8), iterative division for base-85 is performed on the decimal number 894377005 as follows:

(894377005) ÷ 85 = 10522082 + 35 remainder  (9)

(10522082) ÷ 85 = 123789 + 17 remainder (123789) ÷ 85 = 1456 + 29 remainder (1456) ÷ 85 = 17 + 11 remainder

(17) ÷ 85 = 0 + 17 remainder

Assembling the remainders then provides the following five base-85 digits:

17 11 29 17 35 (10)

As in the 4-bit to 6-bit conversion previously described, the digits in (10) above are used as indexes into the 85 character set shown in (5) above, wherein A is 0, B is 1, and so on, until the 85th character / is reached which corresponds to 84. Accordingly, the five base-85 digits 17 11 29 17 35 in (10) above are represented for transmission purposes by the following five characters of the character set shown in (5) above:

R L d R j (11)

Thus, to transmit the first 32-bits of the binary data shown in (6) above, the five characters R L d R j in (11) are transmitted by the E-mail system using their respective ASCII 8-bit equivalents set forth in hex below:

52 4C 64 52 6A which in binary corresponds to:

01010010 01001100 01100100 01010010 01101010

It will thus be evident that the above described conversion resulting from the preferred embodiment of the invention permits the original 32-bits of binary data to be transmitted on the E-mail system using only 40-bits, thereby requiring an expansion of only 4 to 5 or 25% over the original binary data.

The validity of the above described base-85 conversion for E-mail transmission will be understood from the following relationship:

$$84^5 < 2^{32} - 1 < 85^5 \qquad (12)$$

The middle term ($2^{32} - 1$) in the above relationship (12) is the largest value a 32-bit (unsigned) integer can attain. The inequality on the right proves that any 32-bit integer can be represented by no more than 5 base-85 integers. In particular, this guarantees that the last quotient produced using equation (8) above will always be less than 85. The inequality on the left in the above relationship (12) proves that a character set comprised of at least 85 acceptable characters satisfies this condition. It is also possible to achieve the desired 4 to 5 expansion using a base greater than 85, in which case the minimum number of acceptable characters required is changed accordingly. For example, if a base of 90 is employed, the minimum number of acceptable characters required would be 90.

At the receiving end of the E-Mail system, the received ASCII characters, 52 4C 64 52 6A respectively, corresponding to characters R L d R j of the character set in (5) above are used as an index to derive the respectively corresponding base-85 digits 17 11 29 17 35 shown in (10) above. These base-85 digits are then converted back into the first 32-bit number 354F1CD2D shown in (7) above, which may be accomplished using equation (8) above.

Although the above example of the preferred embodiment has been concerned with only the first 32-bits 354F1CD2D of the hex-represented binary data shown in (6) and (7) above, it will be understood that each following 32-bits of the binary data to be transmitted is handled in a like manner.

Reference is next directed to FIG. 1, which illustrates a preferred implementation of the invention in which the above described 85-base conversion approach for converting binary data into ASCII for E-Mail transmission is combined with the binary compression and decompression system disclosed in the commonly assigned U.S. Pat. No. 4,558,302 issued Dec. 10, 1985, Terry A. Welch, inventor. The disclosure in this patent is hereby incorporated herein. The compression and decompression approaches disclosed in this patent are typically referred to as the Welch compression and decompression algorithms.

As shown in FIG. 1, each end of a two-way E-mail communication system 10 is provided with a Welch compressor 12 and a Welch decompressor 14, along with an E-Mail transmitting converter 16 and an E-Mail receiving converter 18. Binary data to be transmitted is first compressed by the Welch compressor 12 and the resulting compressed binary data then applied to the E-Mail transmitting converter 16, which converts the Welch-compressed binary data using 85-base conversion into ASCII for E-Mail transmission, as descried above.

Received ASCII is applied to the E-Mail receiving converter 18, which converts the ASCII into binary using 85-base to binary conversion as described above. The binary data at the output of the E-Mail receiving converter 18, which corresponds to the Welch-compressed data at the output of the Welch compressor 16, is then applied to the Welch decompressor 18, which produces the original binary data.

Figure 2:
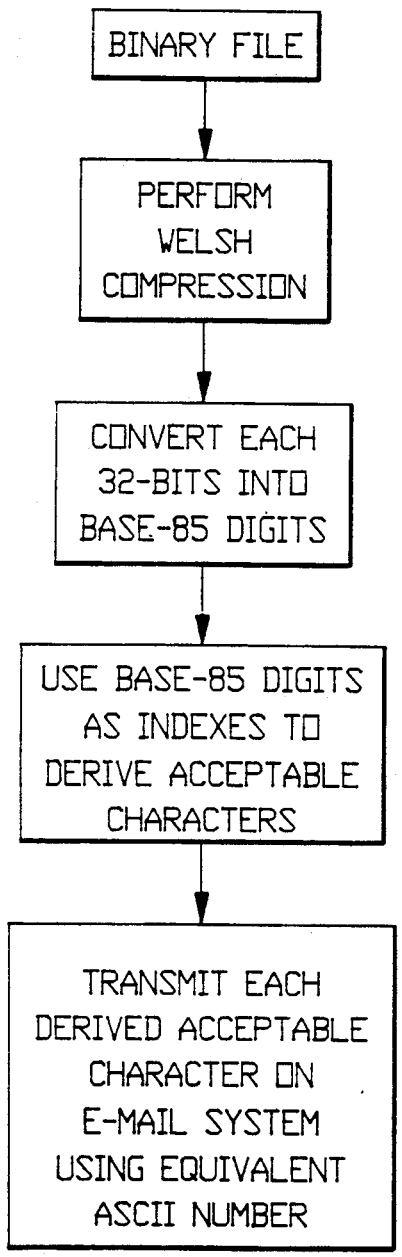
FIG. 2 is a flow chart illustrating the conversion of a binary file into ASCII for E-mail transmission in accordance with the invention.
Figure 3:
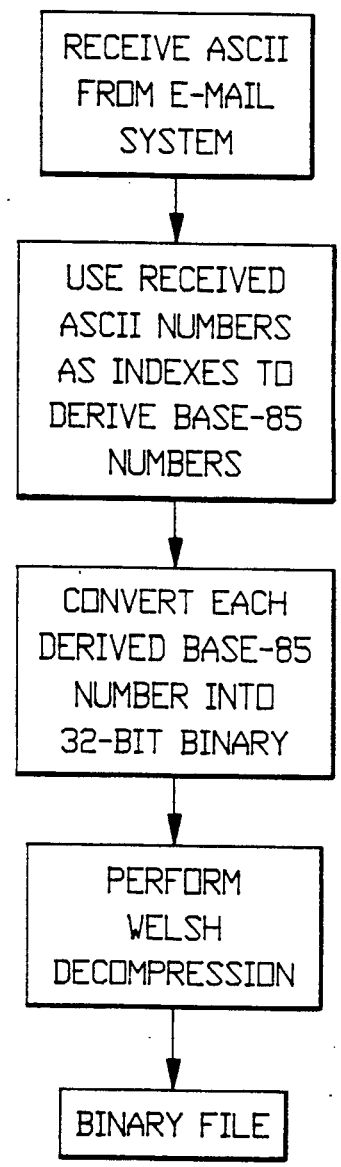
FIG. 3 is a flow chart illustrating the conversion of ASCII received from an E-mail system back into the original binary file in accordance with the invention.

The flow chart in FIG. 2 illustrates how binary data from a binary file is converted into ASCII for E-Mail transmission, while the flow chart in FIG. 3 illustrates how received ASCII is converted back into the original binary file. Examples of how the Welch compression and decompression may be performed can be found in the aforementioned U.S. Pat. NO. 4,558,302. An example of a program in C-language which may be employed for performing the remaining portions of FIGS. 2 and 3, that is, the conversion of binary data into ASCII using binary to 85-base conversion, or for performing the conversion of received ASCII back into binary using base-85 to binary conversion, now follows:

TITLE

A MAIL FILE CONVERSION UTILITY FOR PC FILES

```
           FILE ID:   BINMAIL.C
#include <stdlib.h>
#include <string.h>
#include <signal.h>
#include <stdio.h>
#include <bios.h>
#include <dos.h>
#include <io.h>
#include <sys/types.h>
#include <sys/stat.h>
```

```c
char my_name[]    = "BINMAIL";
char my_release[] = "2.00";

define THIS_RELEASE 200 typedef enum {
            LITERAL,
            OPTION
            } PTYPE;

typedef struct {
            char *s;
            PTYPE type;
            } PARM;

typedef struct {
            int max;
            int total;
            int names;
            } PARM_INFO;

#define MAX_PARMS 10
PARM parm[MAX_PARMS];
PARM_INFO pinfo={MAX_PARMS, 0, 0};

char *edit;

typedef unsigned char BYTE;

#define ESC      0x1B
#define CR       0x0D
#define SPACE    0x20
define CtrlC    0x03 define beep   putch(7)

int receiving,
    overwrite,
    nonstop;

#define BIN_BUFFER_SIZE_100    51
#define TEXT_BUFFER_SIZE_100   ((4*BIN_BUFFER_SIZE_100)/3)

#define BIN_BUFFER_SIZE_200    56
#define TEXT_BUFFER_SIZE_200   ((5*BIN_BUFFER_SIZE_200)/4)

#define BIN_BUFFER_SIZE   (BIN_BUFFER_SIZE_100>BIN_BUFFER_SIZE_200?\
                           BIN_BUFFER_SIZE_100:BIN_BUFFER_SIZE_200)

#define TEXT_BUFFER_SIZE  (TEXT_BUFFER_SIZE_100>TEXT_BUFFER_SIZE_200?\
                           TEXT_BUFFER_SIZE_100:TEXT_BUFFER_SIZE_200)

BYTE text_buffer[80+TEXT_BUFFER_SIZE];   /* Extra for receiving */

BYTE bin_buffer[BIN_BUFFER_SIZE];

char original_dos_id[13];
long original_file_size;
unsigned original_file_date;
unsigned original_file_time;

FILE *fin,
     *fout;

char fin_id[_MAX_PATH],
     fout_id[_MAX_PATH];

char *fin_id_given,
     *fout_id_given="";

char *id_string = "tEag";
```

```
int version;

int valid_versions[] = { 100, 200, 0 };

#define t64   t85
#define t64_  t85_

BYTE t85[] = "ABCDEFGHIJKLMNOPQRSTUVWXYZ"
             "abcdefghijklmnopqrstuvwxyz"
             "0123456789()"
             "\"[]{}<>:;,.+=#$%&*-_/";

BYTE t85_ [256];

int record,
    cksum_errors;

BYTE cksum;

/*

*/
void pascal copyrite(char *who_is, char *which_is)
{
  fprintf(stderr,"\nFile Conversion Utility %s Version %s (%s)\n",
          who_is,which_is,__TIMESTAMP__);
  fprintf(stderr,"Copyright (c) 1990 Unisys Corporation\n");
  fprintf(stderr,"All Rights Reserved\n");
}
/*

*/
void pascal invalid_input(void)
{
  static char *instructs[] =
  {
   "Switch  Command",
   "---------------------------------------------------------------",
   "/R      Recreate a file from a file which is in BINMAIL encoded",
   "        format.  If this switch is not set, the input file will",
   "        be copied to the output file and encoded.\n",
   "/O      Overwrite the output file if it exists.\n",
   "/N      Do not pause if checksum errors are encountered (/R set).\n",
   "/V:nnn  Encode with version level nnn algorithm (/R not set).\n",
   NULL
  };
  char **line;

printf("\a\nInvalid Input Parameters\n");
  printf(
          "Syntax: %s [switches] [d:][path]filename [[d:][path]filename]\n\n",
          my_name);
  for(line=instructs;*line!=NULL;line++)printf("%s\n",*line);
  exit(1);
}  /* invalid_input */
/*

*/
void c_break(void)
{
  static char str[] = "\r\nProcess terminated at user request\r\n";
  char *ptr;

union REGS inregs, outregs;

signal( SIGINT, SIG_IGN );

inregs.h.ah = 0x0e;
  inregs.x.bx = 0;
  ptr = str;
```

```
  while( *ptr )
  {
    inregs.h.al = *ptr++;
    int86( 0x10, &inregs, &outregs );
  } exit(1);
}
/*

*/
unsigned pascal getkey(void)
/* Reads character from the extended keyboard */
{
  union {
          unsigned code;
          struct {
                  BYTE low,
                       high;
                 } bytes;
        } key;

key.code=_bios_keybrd(_KEYBRD_READ);
  if(key.bytes.low==0xE0)key.bytes.low=0;   /* Clear extended flag */
  if(key.bytes.low)key.bytes.high=0;        /* Clear ASCII key scan code */
  return(key.code);
}  /* getkey */
/*

*/
void pascal setup(int argc, char **argv)
{
  int i,
      names_given;

if( parse_parms(argc,argv,my_name,parm,&pinfo) )invalid_input();

if( pinfo.names==0 )invalid_input();

names_given=0;
  receiving=0;
  overwrite=0;
  nonstop=0;
  version=THIS_RELEASE;

for(i=0;i<pinfo.total;i++)
  {
    edit=parm[i].s;
    if( parm[i].type==OPTION )
    {
      switch( toupper(*edit) )
      {
        case 'R':
                if( set_flag(edit,&receiving) )invalid_input();
                break;
        case 'O':
                if( set_flag(edit,&overwrite) )invalid_input();
                break;
        case 'N':
                if( set_flag(edit,&nonstop) )invalid_input();
                break;
        case 'V':
                if( edit[1] != ':' ||
                    (version=atoi(edit+2)) == 0 )invalid_input();
                break;
        default:
                invalid_input();
      } /* End CASE */
    }
    else  /* LITERAL */
    {
```

```c
      if( strpbrk(edit,"*?")!=NULL )
      {
        printf("\a\nWildcards not permitted in filename: \"%s\"\n",edit);
        exit(1);
      }
      switch( names_given )
      {
        case 0:
                fin_id_given=edit;
                break;
        case 1:
                fout_id_given=edit;
                break;
        default:
                invalid_input();
      }
      names_given++;
    }
  }
}
/*

*/
void pascal verify_release(void)
{
  int *v;

for(v=valid_versions;*v;v++)if( *v==version )return;
  printf("\a\nVersion Not Supported: %d\n",version);
  exit(1);
}
/*

*/
void _fastcall four2three(BYTE *in_four, BYTE *out_three)
{
   static BYTE wb;

/* xx000000xx111111xx222222xx333333 */
           /*   aaaaaa   aabbbb   bbbbcc   cccccc */ out_three[0] = t64_[in_four[0]]<<2;
   wb           = t64_[in_four[1]];
   out_three[0] += wb>>4;
   out_three[1] = wb<<4;
   wb           = t64_[in_four[2]];
   out_three[1] += wb>>2;
   out_three[2] = (wb<<6) + t64_[in_four[3]];
}
/*

*/
void _fastcall three2four(BYTE *in_three, BYTE *out_four)
{

/* 000000001111111122222222 */
           /* aaaaaabbbbbbccccccdddddd */ out_four[0] = t64[ in_three[0]>>2 ];
   out_four[1] = t64[ ((in_three[0]&0x03)<<4) + (in_three[1]>>4) ];
   out_four[2] = t64[ ((in_three[1]&0x0f)<<2) + (in_three[2]>>6) ];
   out_four[3] = t64[ in_three[2]&0x3f ];
}
/*

*/
void _fastcall five2four(BYTE *in_five, BYTE *out_four)
{
  static int i;
  static unsigned long xul;
```

```c
    xul=85*t85_[in_five[0]]+t85_[in_five[1]];
    for(i=2;i<5;i++)xul=85*xul+t85_[in_five[i]];

* (unsigned long *) out_four = xul;
}
/*

*/
void _fastcall four2five(BYTE *in_four, BYTE *out_five)
{
    static ldiv_t ldivres;
    static div_t divres;
    static long xl;
    static int xi;
    static int i;
    static unsigned long xul;

xul = * (unsigned long *) in_four;

if( in_four[3]&0x80 )   /* ldiv accepts only signed variables */
    {
        xl=xul/85;
        out_five[4]=t85[(int)(xul-85*xl)];
        i=3;
    }
    else
    {
        xl=xul;
        i=4;
    } while( xl > (unsigned)(-1)>>1 )
    {
        ldivres=ldiv(xl,85L);
        out_five[i]=t85[(int)ldivres.rem];
        xl=ldivres.quot;
        i--;
    } xi=(int)xl;

for(;;)
    {
        divres=div(xi,85);
        out_five[i]=t85[divres.rem];
        if( i==1 )
        {
            out_five[0]=t85[divres.quot];
            return;
        }
        xi=divres.quot;
        i--;
    }
}
/*

*/
void pascal fullpath(char *gname, char *surname, char *nname)
{
    struct stat filestat;
    int len;
    unsigned current_drive_no,
             given_drive_no,
             drivecount;

char cwd[_MAX_PATH];
    char work[_MAX_PATH];

char nname_drive[_MAX_DRIVE];
    char nname_dir[_MAX_DIR];
    char nname_fname[_MAX_FNAME];
    char nname_ext[_MAX_EXT];
```

```
len=strlen( gname );

_dos_getdrive( &current_drive_no );   /* Response is 1-relative */ if( len>1 && gname[1]==':' )
{
  strcpy( nname, gname );
  given_drive_no=toupper(nname[0])-('A'-1);
}
else
{
  sprintf( nname, "%c:%s", current_drive_no+('A'-1), gname );
  given_drive_no=current_drive_no;
  len+=2;
} if( len==2                                      ||
    nname[len-1]=='\\'                          ||
    stat( nname, &filestat )==0                 &&
    (filestat.st_mode&S_IFDIR)==S_IFDIR         )
{
  if( surname==(char *)NULL )invalid_input();
  if( len>2 && nname[len-1]!='\\' )nname[len++]='\\';
  strcpy( nname+len, surname );
}

_splitpath( nname,
            nname_drive, nname_dir,
            nname_fname, nname_ext );

if( current_drive_no != given_drive_no )
  _dos_setdrive( given_drive_no, &drivecount );

getcwd( cwd, _MAX_PATH );   /* To restore later */ if( *nname_dir )
  {
    if( (len=strlen(nname_dir)-1)>0 && nname_dir[len]=='\\' )
      nname_dir[len]=0;
    chdir( nname_dir );
    getcwd( work, _MAX_PATH );
    chdir( cwd );
  } if( current_drive_no != given_drive_no )
    _dos_setdrive( current_drive_no,&drivecount );

/*
 * Now reconstruct the full path name
 */

_makepath( nname,
             nname_drive, *nname_dir ? work+2 : cwd+2,
             nname_fname, nname_ext );

strupr( nname );

}
/*
 *
 */
void pascal open_output_file(void)
{
  unsigned ch;

if( stricmp( fin_id, fout_id )==0 )
    {
      printf("\a\nCannot copy a file to itself: %s\n",fin_id);
      exit(1);
```

```c
}
if( overwrite==0 && access(fout_id,00)==0 )
{
  printf("\nWARNING! File \"%s\" Already Present. Overwrite? (Y/N)",
         fout_id);
  ch = getkey();
  if( toupper( ch )=='Y' )
  {
    printf("Y\n");
  }
  else
  {
    printf("N\nFile Not Written\n");
    exit(1);
  }
} if((fout=fopen(fout_id,"wb"))==NULL)
{
  printf("\a\nCannot Open Output File: %s\n",fout_id);
  exit(1);
} if( signal( SIGINT, c_break ) == SIG_ERR )
{
  fprintf( stderr, "Couldn't set SIGINT\n" );
  abort();
}

}
/*

*/
char *name_of_day(unsigned mo,
                  unsigned day,
                  unsigned yrs  /* Years since 1980 */
                  )
{
  static char *names[] = { "Tue", "Wed", "Thu", "Fri", "Sat", "Sun", "Mon" };
  static int four_years[] = { 0, 366%7, 731%7, 1096%7 };
  static int days_so_far[] = {    0,  31%7,  59%7,  90%7, 120%7, 151%7,
                               181%7, 212%7, 243%7, 273%7, 304%7, 334%7 };

int leap_index;

mo--;     /* Make 0-relative. */
  day--;    /* Make 0-relative */
  yrs%=28;  /* Day and date both will repeat in 28 years */ leap_index = yrs&3;
  return names[ (    ( yrs>>2 ) * (1461%7)
                + four_years[ leap_index ]
                + days_so_far[ mo ]
                + ( mo>1 && leap_index==0 )
                + day                         ) % 7 ];
}
/*

*/
void pascal check_disposition(void)
{
  const char pause_msg[] = "(<Enter> to continue;"
                           " <Space> to continue nonstop;"
                           " <Esc> to abort)";
  unsigned ch;
  printf( pause_msg );
  for(;;)
  {
    ch = getkey();
    switch( ch )
    {
```

```
            case ESC:
                        fcloseall();
                        unlink(fout_id);
            case CtrlC:
                        raise( SIGINT );
            case SPACE:
                        nonstop=1;
            case CR:
                        printf("\n");
                        return;
      }  /* End CASE */
      beep;
   }
}
/*

*/
void pascal checksum_error(void)
{
   printf("\nChecksum Error: Record No %d\n",record);
   if( nonstop==0 )check_disposition();
   cksum_errors++;
}
/*

*/
void pascal write_error(void)
{
   printf("\a\nError Writing File: %s\n",fout_id);
   fcloseall();
   unlink(fout_id);
   exit(1);
}
/*

*/
void pascal text_to_binary(void)
{
   static char *mo_name[] = { "Jan", "Feb", "Mar", "Apr", "May", "Jun",
                              "Jul", "Aug", "Sep", "Oct", "Nov", "Dec"  };

char test_id_string[80];

BYTE *text_ptr;

char *am_pm;

unsigned  yr,
          mo,
          day;

unsigned  hr,
          min,
          sec;

int i,
    j,
    cksum_record,
    cksum_read,
    bytes_this_write;

long bytes_to_go;

fullpath( fin_id_given, (char *)NULL, fin_id );

if( (fin=fopen(fin_id,"rt"))==NULL )
{
   printf("\a\nCannot Open Input File: %s\n",fin_id);
   exit(1);
}
```

```
while(1)
{
  if( fgets(text_buffer,80,fin)==NULL )
  {
    printf("\a\nInvalid Input File Format\n");
    exit(1);
  }
  if( sscanf(text_buffer,
             "%s %d %s %ld %x %x",
             test_id_string,
             &version,
             original_dos_id,
             &original_file_size,
             &original_file_date,
             &original_file_time )==6      &&
      strcmp(test_id_string,id_string)==0  )
  {
    verify_release();
    break;
  }
} fullpath( fout_id_given, original_dos_id, fout_id );

open_output_file();

yr=original_file_date;
day=yr&0x1F;
yr>>=5;
mo=yr&0x0F;
yr>>=4;
hr=original_file_time;
sec=(hr&0x1F)<<1;
hr>>=5;
min=hr&0x3F;
hr>>=6;

am_pm = hr<12 ? "am" : "pm" ;
if( hr>12 )
   hr-=12;
else
   if( hr==0 )hr=12;

printf("\n%s (%ld bytes: %s %s %u, %u at %u:%02u:%02u %s)\n",
        original_dos_id,
        original_file_size,
        name_of_day(mo,day,yr),
        mo_name[mo-1],day,1980+yr,
        hr,min,sec,am_pm                                   );

printf("\nDecoding (%d) \"%s\" as \"%s\" ... ",version,fin_id,fout_id);

memset(t85_,0,256);
for(i=0;i<85;i++)t85_[t85[i]]=i;

bytes_to_go=original_file_size;

record=1;
cksum_record=1;
cksum_errors=0;
switch( version )
  {
/*
*/
    case 100:
/*
*/
       while( bytes_to_go &&
              fgets(text_buffer,TEXT_BUFFER_SIZE_100+80,fin) != NULL )
```

```c
    {
      record++;
      text_ptr=text_buffer+strspn(text_buffer," ");
      if( *text_ptr=='\n' )continue;
      cksum_record++;
      for(i=0,j=0;i<TEXT_BUFFER_SIZE_100;i+=4,j+=3)
        four2three(text_ptr+i,bin_buffer+j);
      cksum=cksum_record&0xff;
      for(i=0;i<BIN_BUFFER_SIZE_100;i++)cksum=(cksum+i*bin_buffer[i])&0xff;
      sscanf(text_ptr+TEXT_BUFFER_SIZE_100,"%2x",&cksum_read);
      if( cksum_read != cksum )checksum_error();
      bytes_this_write=min(bytes_to_go,BIN_BUFFER_SIZE_100);
      if( fwrite(bin_buffer,bytes_this_write,1,fout)==0 )write_error();
      bytes_to_go-=bytes_this_write;
    }
    break;
/*
 */
    case 200:
/*
 */
    while( bytes_to_go &&
           fgets(text_buffer,TEXT_BUFFER_SIZE_200+80,fin) != NULL )
    {
      record++;
      text_ptr=text_buffer+strspn(text_buffer," ");
      if( *text_ptr=='\n' )continue;
      cksum_record++;
      for(i=0,j=0;i<TEXT_BUFFER_SIZE_200;i+=5,j+=4)
        five2four(text_ptr+i,bin_buffer+j);
      cksum=cksum_record&0xff;
      for(i=0;i<(BIN_BUFFER_SIZE_200-1);i++)cksum^=bin_buffer[i];
      if( bin_buffer[(BIN_BUFFER_SIZE_200-1)] != cksum )checksum_error();
      bytes_this_write=min( bytes_to_go,(BIN_BUFFER_SIZE_200-1) );
      if( fwrite(bin_buffer,bytes_this_write,1,fout)==0 )write_error();
      bytes_to_go-=bytes_this_write;
    }
    break;
/*
 *
 * End cases
 *
 */
  } if(bytes_to_go)
  {
    printf("\a\nInvalid File Size\n\n");
    exit(1);
  } fflush(fout);

_dos_setftime(fileno(fout),original_file_date,original_file_time);

fclose(fout);

printf("Done\n%d Checksum Errors\n",cksum_errors);

}
/*

*/
void pascal binary_to_text(void)
{
  int i,
      j;

char default_output_name[13];

struct find_t ffblk;
```

```
verify_release();

fullpath( fin_id_given, (char *)NULL, fin_id );

if( _dos_findfirst(fin_id,_A_NORMAL|_A_RDONLY,&ffblk) ||
    (fin=fopen(fin_id,"rb"))==NULL                        )
{
  printf("\a\nCannot Open Input File: %s\n",fin_id);
  exit(1);
} strcpy( default_output_name,ffblk.name );
if( (edit=strchr( default_output_name,'.' )) != (char *)NULL )*edit=0;
strcat( default_output_name,".BMA" );

fullpath( fout_id_given, default_output_name, fout_id );

open_output_file();

printf("\nEncoding (%d) \"%s\" as \"%s\" ... ",version,fin_id,fout_id);

memset(text_buffer,t85[0],TEXT_BUFFER_SIZE);

fprintf(fout,
        "%s %d %s %ld %04X %04X\r\n",
        id_string,
         version,
         ffblk.name,
         ffblk.size,
         ffblk.wr_date,
         ffblk.wr_time            );

record=1;

switch( version )
   {
/*
 */
    case 100:
/*
 */
      while(fread(bin_buffer,1,BIN_BUFFER_SIZE_100,fin)>0)
       {
         record++;
         for(i=0,j=0;i<BIN_BUFFER_SIZE_100;i+=3,j+=4)
            three2four(bin_buffer+i,text_buffer+j);
         cksum=record&0xff;
         for(i=0;i<BIN_BUFFER_SIZE_100;i++)cksum=(cksum+i*bin_buffer[i])&0xff;
         if( fwrite(text_buffer,TEXT_BUFFER_SIZE_100,1,fout)==0 ||
             fprintf(fout,"%02X\r\n",cksum) != 4                    )
            write_error();
       }
       break;
/*
 */
    case 200:
/*
 */
      while(fread(bin_buffer,1,(BIN_BUFFER_SIZE_200-1),fin)>0)
       {
         record++;
         cksum=record&0xff;
         for(i=0;i<(BIN_BUFFER_SIZE_200-1);i++)cksum^=bin_buffer[i];
         bin_buffer[(BIN_BUFFER_SIZE_200-1)]=cksum;
         for(i=0,j=0;i<BIN_BUFFER_SIZE_200;i+=4,j+=5)
         four2five(bin_buffer+i,text_buffer+j);
         if( fwrite(text_buffer,TEXT_BUFFER_SIZE_200,1,fout)==0 ||
             fwrite("\r\n",2,1,fout)==0                            )
           write_error();
       }
       break;
```

```
/*
 *
    End cases
 *
 */
  } printf("Done\n%d Records Written\n",record);

}
/*

*/
void main(int argc, char **argv)
{ copyrite(my_name,my_release);

setup(argc,argv);

if(receiving)
     text_to_binary();
  else
     binary_to_text();

exit(0);
}
```

It is to be understood that the present invention is not limited to the particular implementation and/or examples disclosed herein, and is accordingly to be considered as including all modifications and variations coming within the scope of the appended claim.

What is claimed is:

1. In an electronically implemented method for transmitting binary a data using a data communication system which restricts the number of acceptable characters for transmission, the steps of:
   converting each of a predetermined plurality of bits of the binary data to be transmitted into a predetermined plurality of digits in a predetermined base,
   deriving a corresponding acceptable character for transmission on said data communication means in response to each digit produced by said converting, each digit of said predetermined base corresponding to a different acceptable character; and
   producing binary signals representing the derived acceptable characters for transmission on said system, said predetermined base being chosen so that the number of bits constituted by the binary signals produced for transmission of each predetermined plurality of digits is no more than 25% greater than said predetermined plurality of bits.

2. The method of claim 1, including performing Welch compression on the binary data to be transmitted prior to said converting.

3. Electronically implemented apparatus for preparing binary a data for transmission on a data communication system which restricts the number of acceptable characters for transmission comprising:
   compression means for compressing the binary data to be transmitted using Welch compression and producing compressed binary signals corresponding thereto;
   conversion means for converting each of a predetermined plurality of bits of said compressed binary signals into a predetermined plurality of digits in a predetermined base;
   means for deriving a corresponding acceptable character for each digit produced by said conversion means, each digit of said predetermined base corresponding to a different acceptable character; and
   means producing binary signals representing the derived acceptable characters for transmission on said data communication means.

4. In a data communication system, the combination comprising:
   compression means for compressing the binary data to be transmitted using Welch compression and producing compressed binary signals corresponding thereto;
   a binary data communication system which restricts the number of acceptable characters for transmission;
   conversion means for converting each of a predetermined plurality of bits of said compressed binary signals into a predetermined plurality of digits in a predetermined base;
   means for deriving a corresponding acceptable character for each digit produced by said conversion means, each digit of said predetermined base corresponding to a different acceptable character;
   means producing binary signals representing the derived characters;
   means for transmitting the binary signals representing the derived characters on said communication system;
   means for receiving binary signals from said data communication means;
   means for deriving digits in said predetermined base from the received binary signals;
   conversion means for converting each of said predetermined plurality of derived digits in said predetermined base into a corresponding binary number having said predetermined plurality of bits;
   means for producing output binary signals representing each binary number obtained from said last mentioned conversion means; and means providing for Welch decompression of the output binary signals provided by said means for producing.

5. The invention defined by claim 1, 2, 3, or 4, wherein said predetermined plurality of bits comprises 32 bits.

6. The invention defined by claim 5, wherein said predetermined plurality of digits in said predetermined base comprises 5 digits.

7. The invention defined by claim 6, wherein said predetermined base is 85 or greater.

8. The invention defined by claim 7, wherein the number of acceptable characters is equal or greater than said predetermined base.

9. The invention defined by claim 8, wherein said predetermined base is 85.

10. The invention defined by claim 1, 2, 3, or 4, wherein the derivation of a corresponding acceptable character for each digit in said predetermined base is accomplished by using said digit as an index into the set of acceptable characters.

11. The invention defined by claim 1, 2, 3, or 4, wherein the conversion of binary into said predetermined base is accomplished using an iterative divide-by-radix approach.

* * * * *

UNITED STATES PATENT AND TRADEMARK OFFICE
CERTIFICATE OF CORRECTION

PATENT NO. : 5,136,291

DATED : August 4, 1992

INVENTOR(S) : TOMMY K. TEAGUE

It is certified that error appears in the above-identified patent and that said Letters Patent is hereby corrected as shown below:

In the drawings, sheet 1, Fig. 1, change the label on the upper-right Box 14 to --WELCH DECOMPRESSOR--.

Signed and Sealed this

Twenty-first Day of September, 1993

*Attest:*

BRUCE LEHMAN

*Attesting Officer*     *Commissioner of Patents and Trademarks*